United States Patent
Tsai et al.

(10) Patent No.: US 10,375,856 B2
(45) Date of Patent: Aug. 6, 2019

(54) LIQUID COOLING SYSTEM

(71) Applicant: COOLER MASTER CO., LTD., New Taipei (TW)

(72) Inventors: Chang-Han Tsai, New Taipei (TW); Shui-Fa Tsai, New Taipei (TW); Hsin-Hung Chen, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 79 days.

(21) Appl. No.: 15/429,186

(22) Filed: Feb. 10, 2017

(65) Prior Publication Data

US 2017/0325357 A1    Nov. 9, 2017

(30) Foreign Application Priority Data

May 4, 2016    (CN) .......................... 2016 1 0288691

(51) Int. Cl.
| | |
|---|---|
| H05K 7/20 | (2006.01) |
| H01L 23/467 | (2006.01) |
| H01L 23/473 | (2006.01) |
| F28F 9/00 | (2006.01) |
| F28D 1/053 | (2006.01) |
| B60H 1/00 | (2006.01) |
| B60K 11/04 | (2006.01) |
| F28D 21/00 | (2006.01) |

(52) U.S. Cl.
CPC ....... H05K 7/2029 (2013.01); F28D 1/05366 (2013.01); F28F 9/002 (2013.01); H01L 23/467 (2013.01); H01L 23/473 (2013.01); H05K 7/20327 (2013.01); B60H 2001/00078 (2013.01); B60K 11/04 (2013.01); F28D 2021/0031 (2013.01); F28F 2280/10 (2013.01)

(58) Field of Classification Search
CPC .. H05K 7/2029; H05K 7/20327; B60K 11/04; B60H 2001/00078
USPC ................ 165/121, 148, 67, 68, 41, 104.33
See application file for complete search history.

(56) References Cited

U.S. PATENT DOCUMENTS

| | | | | |
|---|---|---|---|---|
| 2005/0141191 | A1* | 6/2005 | Long ......................... | G06F 1/20 361/690 |
| 2005/0168939 | A1* | 8/2005 | Iijima ................. | F28D 1/05375 361/679.47 |
| 2006/0054306 | A1* | 3/2006 | Kent ....................... | F28F 9/002 165/67 |
| 2006/0219451 | A1* | 10/2006 | Schmitt .................. | B60K 11/04 180/68.4 |
| 2010/0155024 | A1* | 6/2010 | Gwin ...................... | F28D 15/00 165/80.4 |
| 2010/0314426 | A1* | 12/2010 | Yokoi .................... | B60K 11/04 224/555 |

FOREIGN PATENT DOCUMENTS

| | | |
|---|---|---|
| TW | 200738124 | 10/2007 |
| TW | M511738 U | 11/2015 |

* cited by examiner

Primary Examiner — Joel M Attey
(74) Attorney, Agent, or Firm — Maschoff Brennan

(57) ABSTRACT

A liquid cooling system includes a liquid cooling head, a fixing member and a radiator. The fixing member is disposed on the liquid cooling head. The radiator is disposed on the liquid cooling head through the fixing member. The radiator moves with respect to the liquid cooling head between at least two different positions through the fixing member.

13 Claims, 16 Drawing Sheets

LIQUID COOLING SYSTEM

CROSS REFERENCE TO RELATED APPLICATION

This application claims the benefit of China Application No. 201610288691.9, which was filed on May 4, 2016, and is incorporated herein by reference.

BACKGROUND OF THE INVENTION

1. Field of the Invention

The invention relates to a liquid cooling system and, more particularly, to a liquid cooling system allowing a radiator to move with respect to a liquid cooling head between at least two different positions.

2. Description of the Prior Art

Heat dissipating device is a significant component for electronic devices. When an electronic device is operating, the current in circuit will generate unnecessary heat due to impedance. If the heat is accumulated in the electronic components of the electronic device without dissipating immediately, the electronic components may get damage due to the accumulated heat. Therefore, the performance of heat dissipating device is a significant issue for the electronic device.

So far the heat dissipating device used in the electronic device usually consists of a heat pipe, a heat dissipating fin and a fan, wherein an end of the heat pipe contacts the electronic component, which generates heat during operation, another end of the heat pipe is connected to the heat dissipating fin, and the fan blows air to the heat dissipating fin, so as to dissipate heat. However, the fan may generate noise and consume high power under high speed and the aforesaid problems are difficult to be solved by the manufacturer. Accordingly, a liquid cooling system is developed.

In general, a liquid cooling system essentially consists of a liquid cooling head, a radiator and a pump. When the liquid cooling system is dissipating heat from an electronic component, the pump transports a cooling liquid to the liquid cooling head, the cooling liquid absorbs the heat generated by the electronic component, and then the radiator cools the cooling liquid. In the liquid cooling system, the related positions between the liquid cooling head, the radiator and the pump are fixed and cannot be adjusted. Furthermore, since the arrangements of the electronic components in different electronic devices are different from each other, the space used for installing the liquid cooling system in the electronic device is limited. Accordingly, the liquid cooling system has to be customized for different electronic devices, such that the liquid cooling system is not flexible in use and the manufacturing cost may increase.

SUMMARY OF THE INVENTION

The invention provides a liquid cooling system allowing a radiator to move with respect to a liquid cooling head between at least two different positions, so as to solve the aforesaid problems.

According to an embodiment of the invention, a liquid cooling system comprises a liquid cooling head, a fixing member and a radiator. The fixing member is disposed on the liquid cooling head. The radiator is disposed on the liquid cooling head through the fixing member. The radiator moves with respect to the liquid cooling head between at least two different positions through the fixing member.

As mentioned in the above, since the radiator can move with respect to the liquid cooling head between at least two different positions, a user or a manufacturer can adjust the position of the radiator with respect to the liquid cooling head according to the arrangement of electronic components in an electronic device, so as to prevent the liquid cooling system from interfering with the electronic components in the electronic device. Accordingly, the liquid cooling system of the invention can be applied to various electronic devices.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
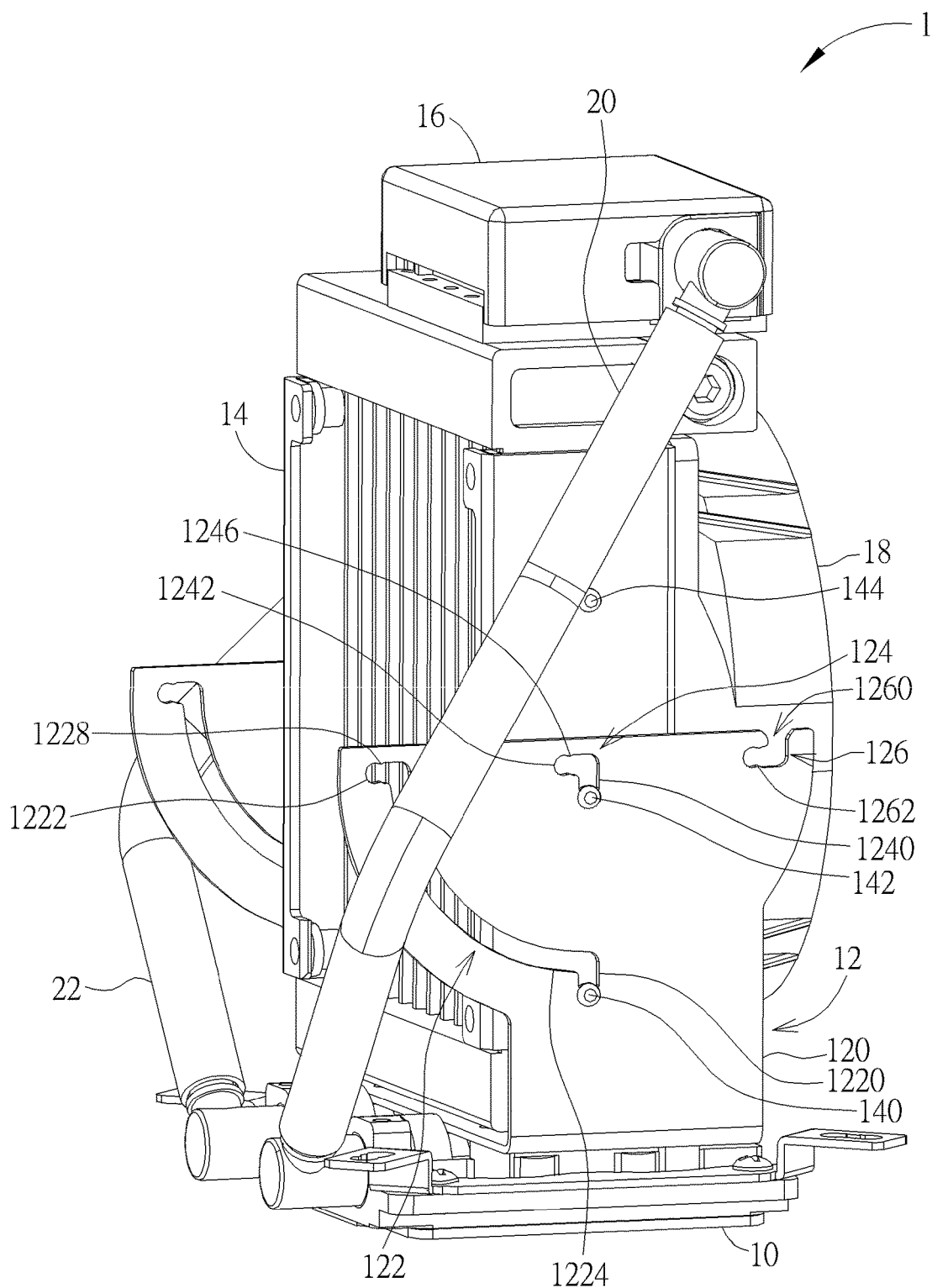
FIG. 1 is a schematic view illustrating a liquid cooling system according to an embodiment of the invention.
Figure 2:
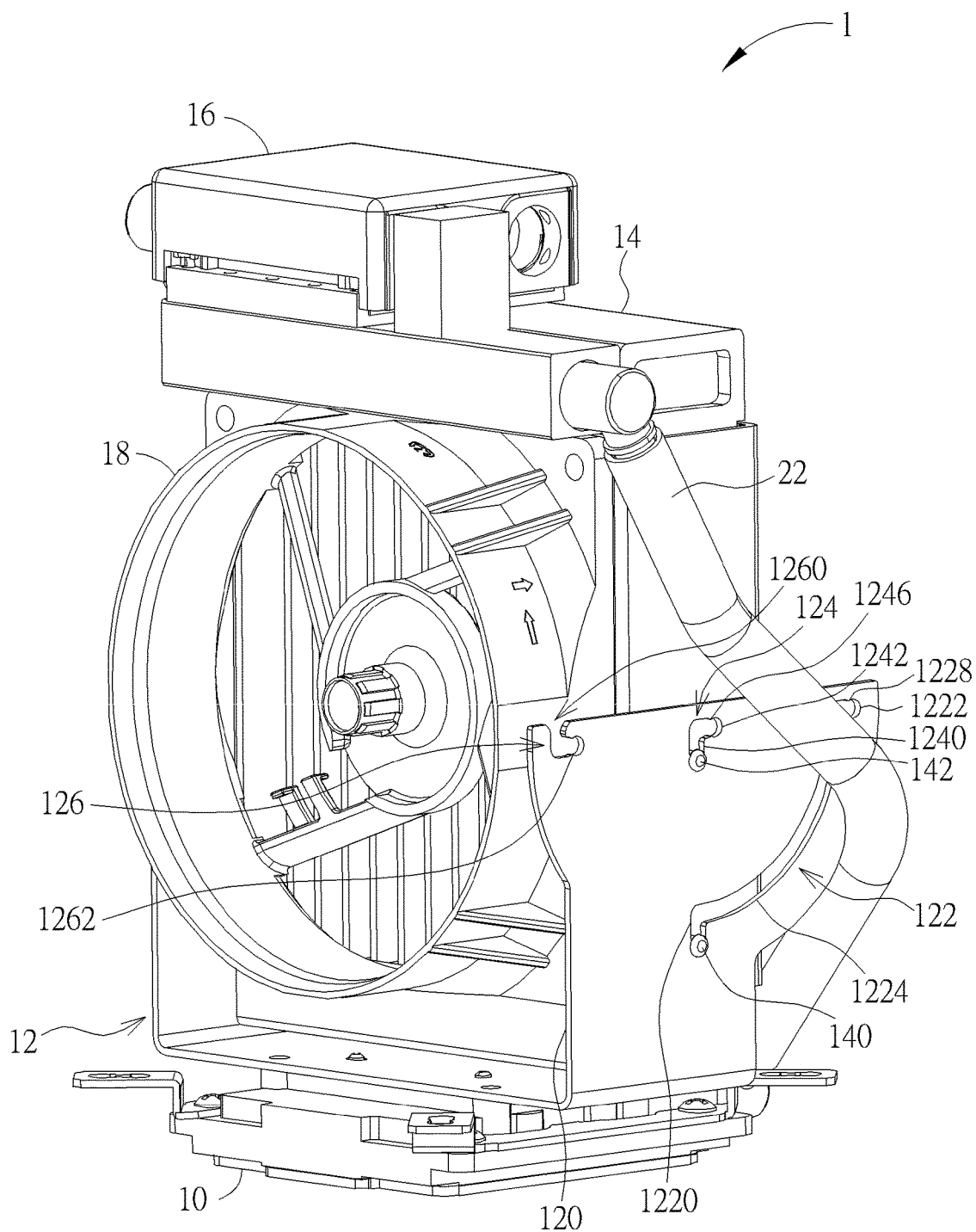
FIG. 2 is a schematic view illustrating the liquid cooling system shown in FIG. 1 from another viewing angle.
Figure 3:
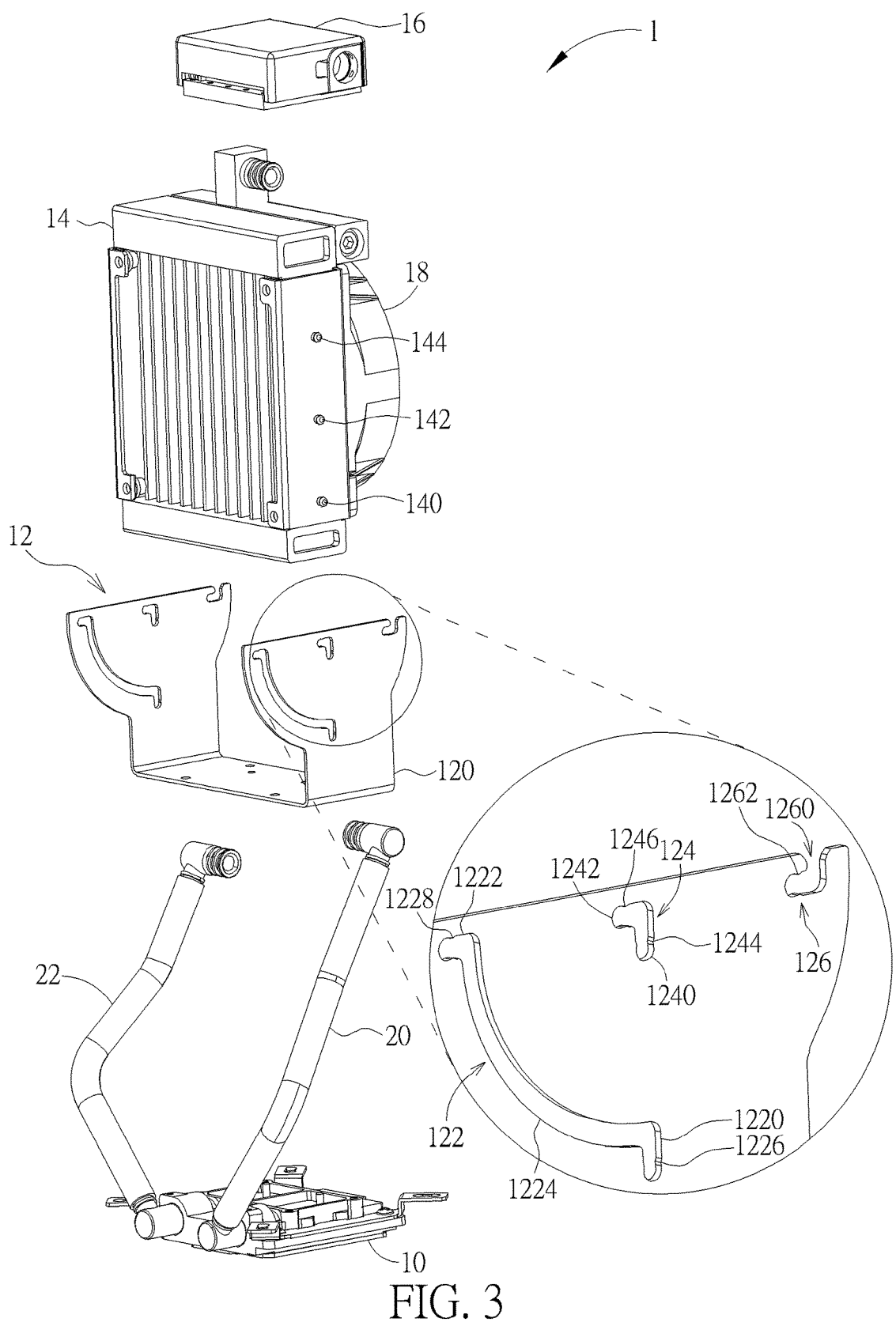
FIG. 3 is an exploded view illustrating the liquid cooling system shown in FIG. 1.

Referring to FIGS. 1 to 3, FIG. 1 is a schematic view illustrating a liquid cooling system 1 according to an embodiment of the invention, FIG. 2 is a schematic view illustrating the liquid cooling system 1 shown in FIG. 1 from another viewing angle, and FIG. 3 is an exploded view illustrating the liquid cooling system 1 shown in FIG. 1.

As shown in FIGS. 1 to 3, the liquid cooling system 1 comprises a liquid cooling head 10, a fixing member 12, a radiator 14, a pump 16, a fan 18 and two tubes 20, 22. The pump 16 and the fan 18 are disposed on the radiator 14. However, in another embodiment, the pump 16 may also be disposed on the liquid cooling head 10. In other words, the pump 16 may be selectively disposed on the radiator 14 or the liquid cooling head 10 according to practical applications. The fixing member 12 is disposed on the liquid cooling head 10 and the fixing member 12 has two side plates 120 opposite to each other, wherein each of the side plates 120 has a first rail 122, a second rail 124 and a third rail 126. The radiator 14 is disposed between the two side plates 120 and opposite sides of the radiator 14 have a first protruding portion 140, a second protruding portion 142 and a third protruding portion 144, wherein the first protruding portion 140 is disposed in the first rail 122 and the second protruding portion 142 is disposed in the second rail 124. In other words, the radiator 14 is disposed on the liquid cooling head 10 through the fixing member 12. In this embodiment, the first protruding portion 140, the second protruding portion 142 and the third protruding portion 144 may be rivets, screws or other objects. The tube 20 connects the liquid cooling head 10 and the pump 16 and the tube 22 connects the liquid cooling head 10 and the radiator 14.

The first rail 122 has two first straight grooves 1220, 1222 and a curved groove 1224, wherein the two first straight grooves 1220, 1222 are connected to opposite ends of the curved groove 1224. The second rail 124 has two second straight grooves 1240, 1242, wherein the two second straight grooves 1240, 1242 are connected to each other. Furthermore, extending directions of the two first straight grooves 1220, 1222 correspond to extending directions of the two second straight grooves 1240, 1242. In other words, the extending direction of the first straight groove 1220 is identical to the extending direction of the second straight groove 1240 and the extending direction of the first straight groove 1222 is identical to the extending direction of the second straight groove 1242. The third rail 126 is a straight groove and the third rail 126 has an opening 1260. Still further, the extending direction of the third rail 126 is identical to the extending directions of the first straight groove 1222 and the second straight groove 1242.

As shown in FIG. 3, each of the first straight grooves 1220, 1222 has a first fixing structure 1226, 1228, each of the second straight grooves 1240, 1242 has a second fixing structure 1244, 1246, and the third rail 126 has a third fixing structure 1262, wherein the first fixing structures 1226, 1228 are used for fixing the first protruding portion 140, the second fixing structures 1244, 1246 are used for fixing the second protruding portion 142, and the third fixing structure 1262 is used for fixing the third protruding portion 144. In this embodiment, the first fixing structures 1226, 1228, the second fixing structures 1244, 1246, and the third fixing structure 1262 may be neck portions protruded from inner walls of the first straight grooves 1220, 1222, the second straight grooves 1240, 1242, and the third rail 126.

Figure 4:
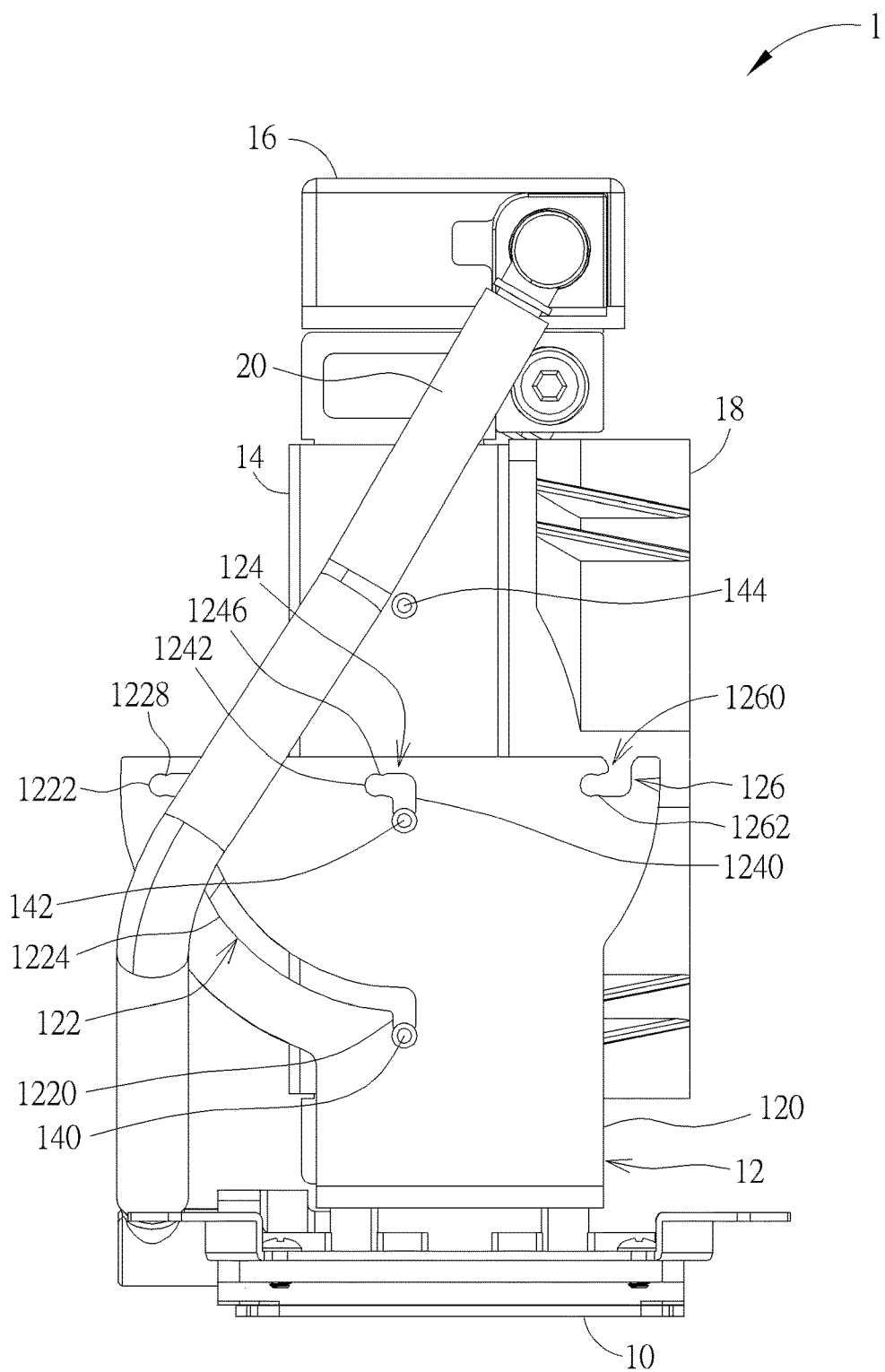
FIG. 4 is a side view illustrating the liquid cooling system shown in FIG. 1.
Figure 5:
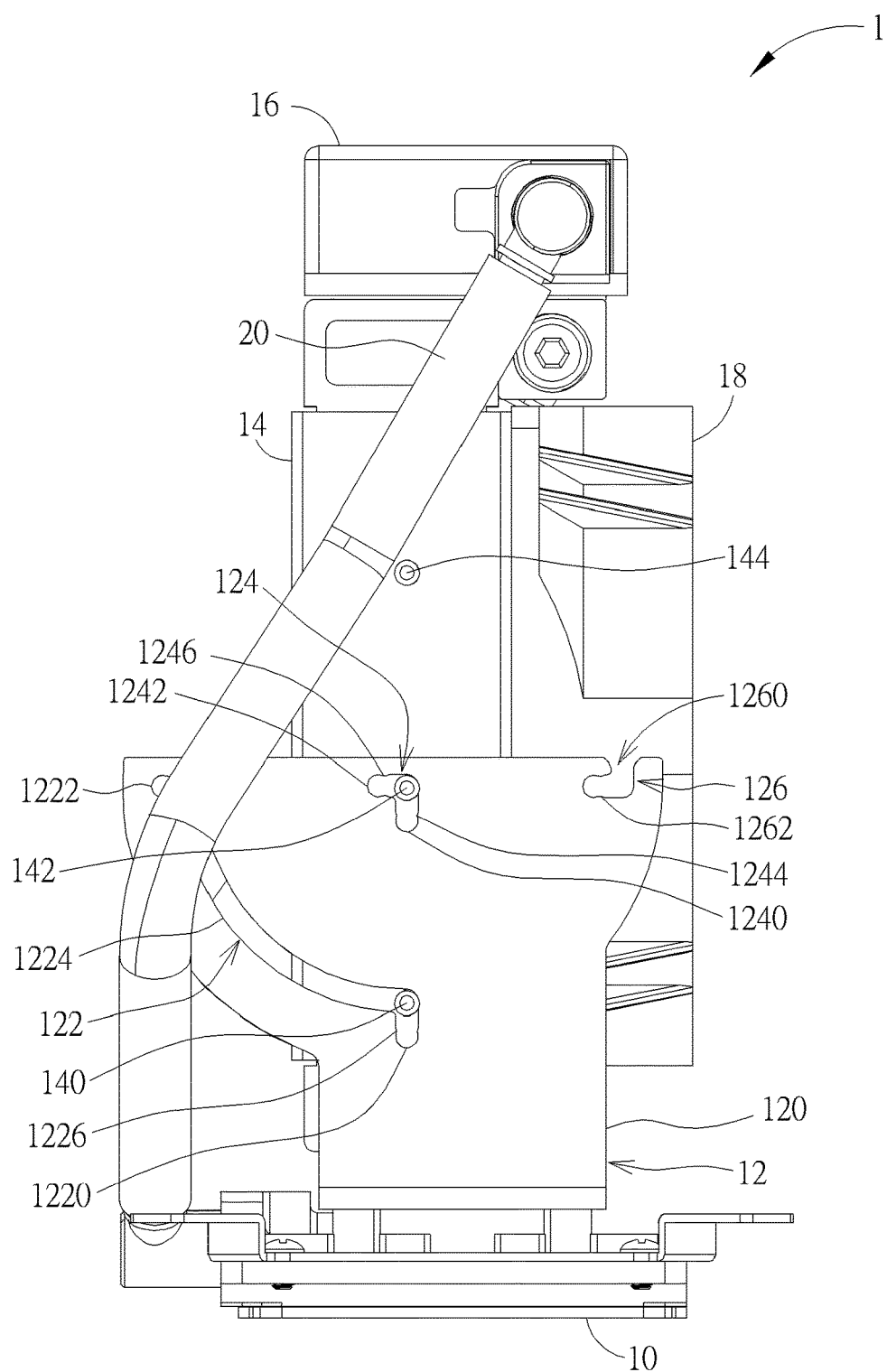
FIG. 5 is a schematic view illustrating the radiator shown in FIG. 4 after moving upward.
Figure 6:
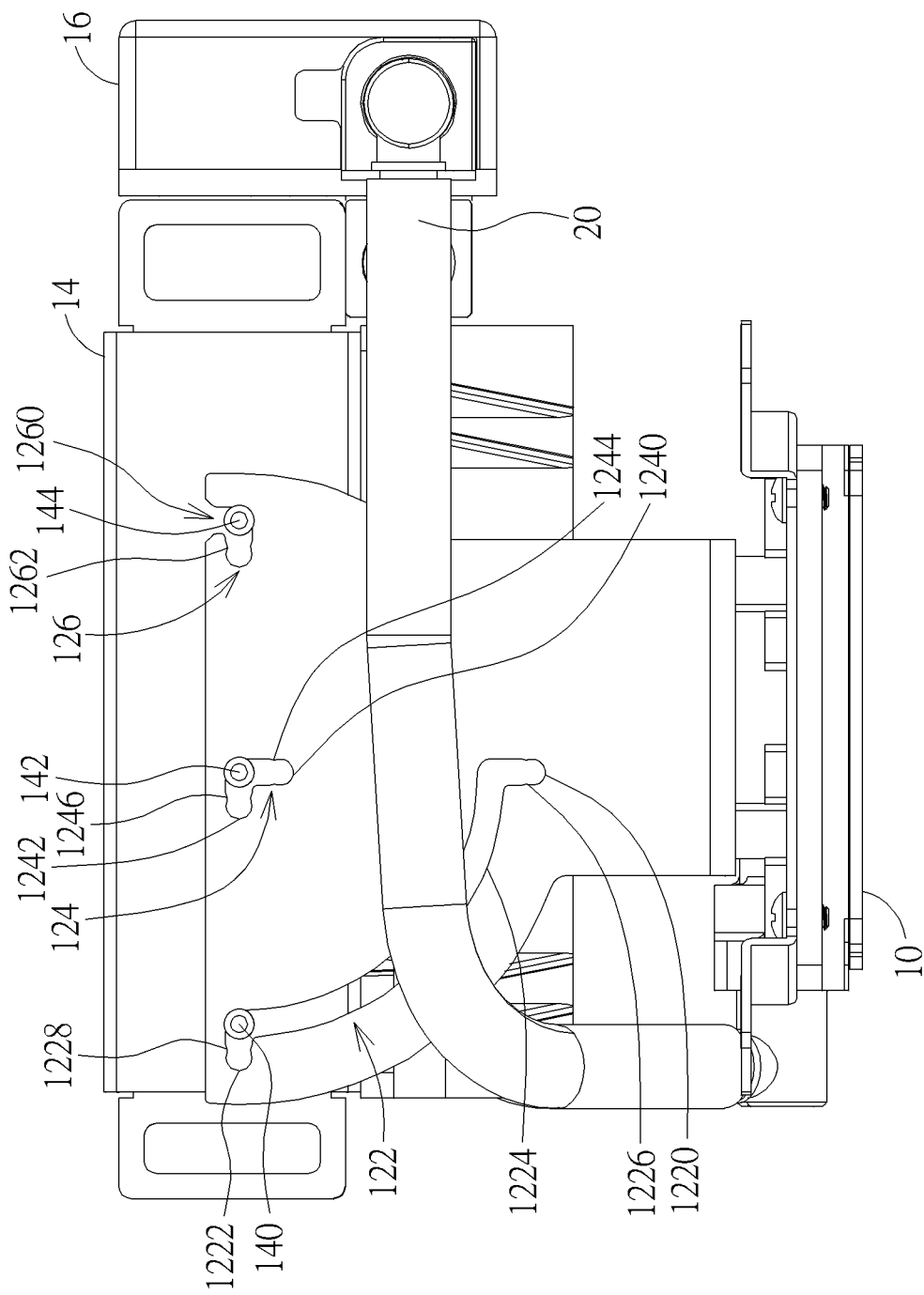
FIG. 6 is a schematic view illustrating the radiator shown in FIG. 5 after rotating.
Figure 7:
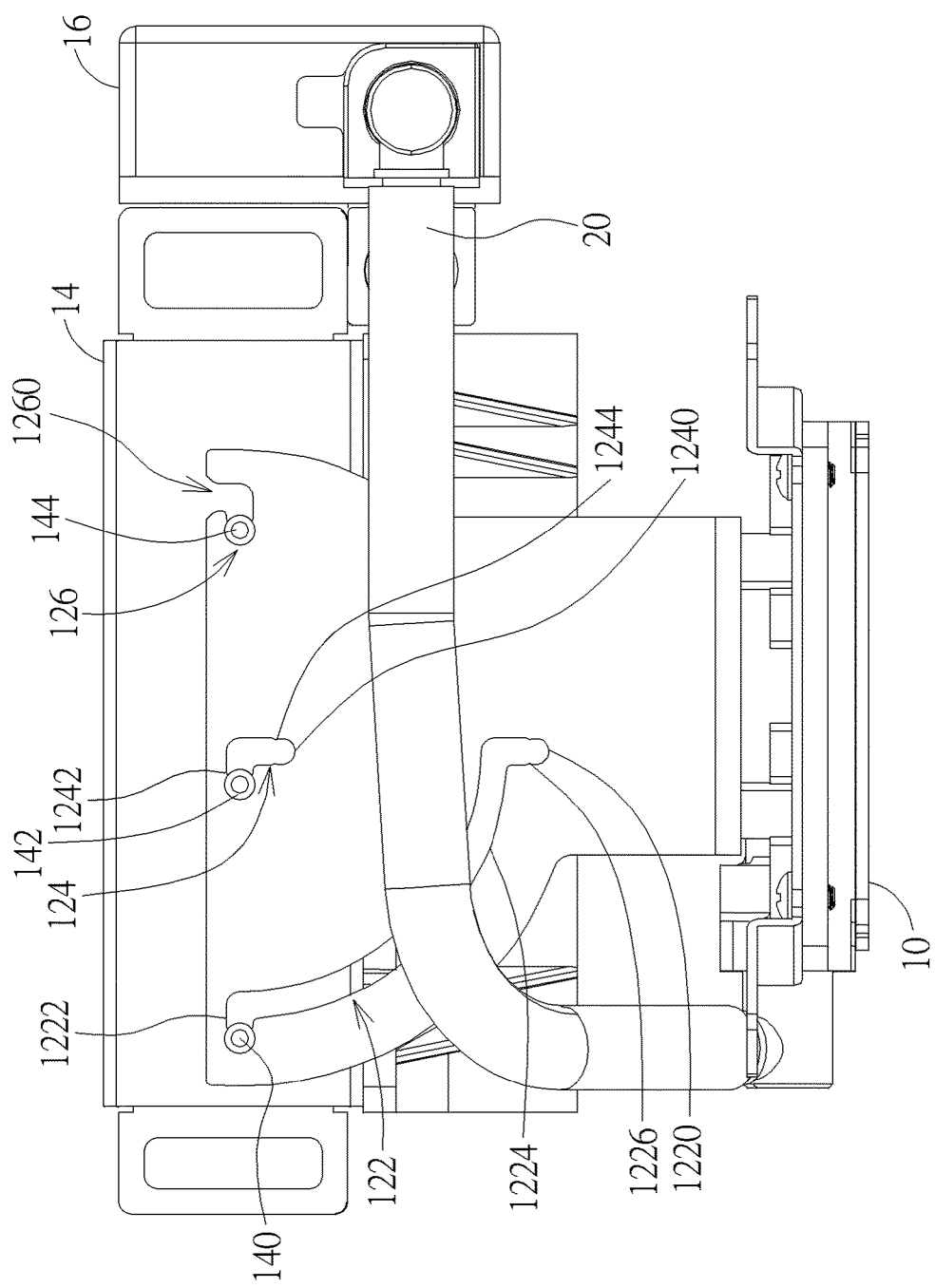
FIG. 7 is a schematic view illustrating the radiator shown in FIG. 6 after moving leftward.

Referring to FIGS. 4 to 7, FIG. 4 is a side view illustrating the liquid cooling system 1 shown in FIG. 1, FIG. 5 is a schematic view illustrating the radiator 14 shown in FIG. 4 after moving upward, FIG. 6 is a schematic view illustrating the radiator 14 shown in FIG. 5 after rotating, and FIG. 7 is a schematic view illustrating the radiator 14 shown in FIG. 6 after moving leftward.

As shown in FIGS. 4 to 7, the first protruding portion 140 and the second protruding portion 142 of the radiator 14 can move with respect to the first rail 122 and the second rail 124, respectively, such that the radiator 14 can move with respect to the liquid cooling head 10 between at least two different positions. In this embodiment, the curved groove 1224 of the first rail 122 is a quarter-circle groove and the two second straight grooves 1240, 1242 of the second rail 124 are connected to form an L shape. Accordingly, the radiator 14 can move with respect to the liquid cooling head 10 between a vertical position shown in FIGS. 4-5 and a horizontal position shown in FIGS. 6-7. It should be noted that the invention may allow the radiator 14 to move with respect to the liquid cooling head 10 to any position or angle through the first rail 122 and the second rail 124 by appropriate design. Furthermore, when the radiator 14 rotates with respect to the liquid cooling head 10, the third protruding portion 144 of the radiator 14 can enter or exit the third rail 126 through the opening 1260.

When the radiator 14 moves with respect to the liquid cooling head 10 to the vertical position shown in FIG. 4, the first protruding portion 140 and the second protruding portion 142 of the radiator 14 are engaged with the first fixing structure 1226 of the first straight groove 1220 and the second fixing structure 1244 of the second straight groove 1240, respectively. If a user wants to move the radiator 14 with respect to the liquid cooling head 10 from the vertical position shown in FIG. 4 to the horizontal position shown in FIG. 7, the user can move the radiator 14 with respect to the liquid cooling head 10 upward first. At this time, the first protruding portion 140 and the second protruding portion 142 of the radiator 14 are disengaged from the first fixing structure 1226 of the first straight groove 1220 and the second fixing structure 1244 of the second straight groove 1240, respectively, and then move to the positions shown in FIG. 5. Then, the user can rotate the radiator 14 with respect to the liquid cooling head 10 along the curved groove 1224 to the position shown in FIG. 6. At this time, the third protruding portion 144 of the radiator 14 enters the third rail 126 through the opening 1260. Then, the user can move the radiator 14 with respect to the liquid cooling head 10 leftward to the position shown in FIG. 7. At this time, the first protruding portion 140, the second protruding portion 142 and the third protruding portion 144 of the radiator 14 are engaged with the first fixing structure 1228 of the first straight groove 1222, the second fixing structure 1246 of the second straight groove 1242 and the third fixing structure 1262 of the third rail 126, respectively.

If the user wants to move the radiator 14 with respect to the liquid cooling head 10 from the horizontal position shown in FIG. 7 to the vertical position shown in FIG. 4, the user can perform the aforesaid operation reversely and the repeated explanation will not be depicted herein again. Accordingly, the radiator 14 can move with respect to the liquid cooling head 10 between at least two different positions through the fixing member 12.

Figure 8:
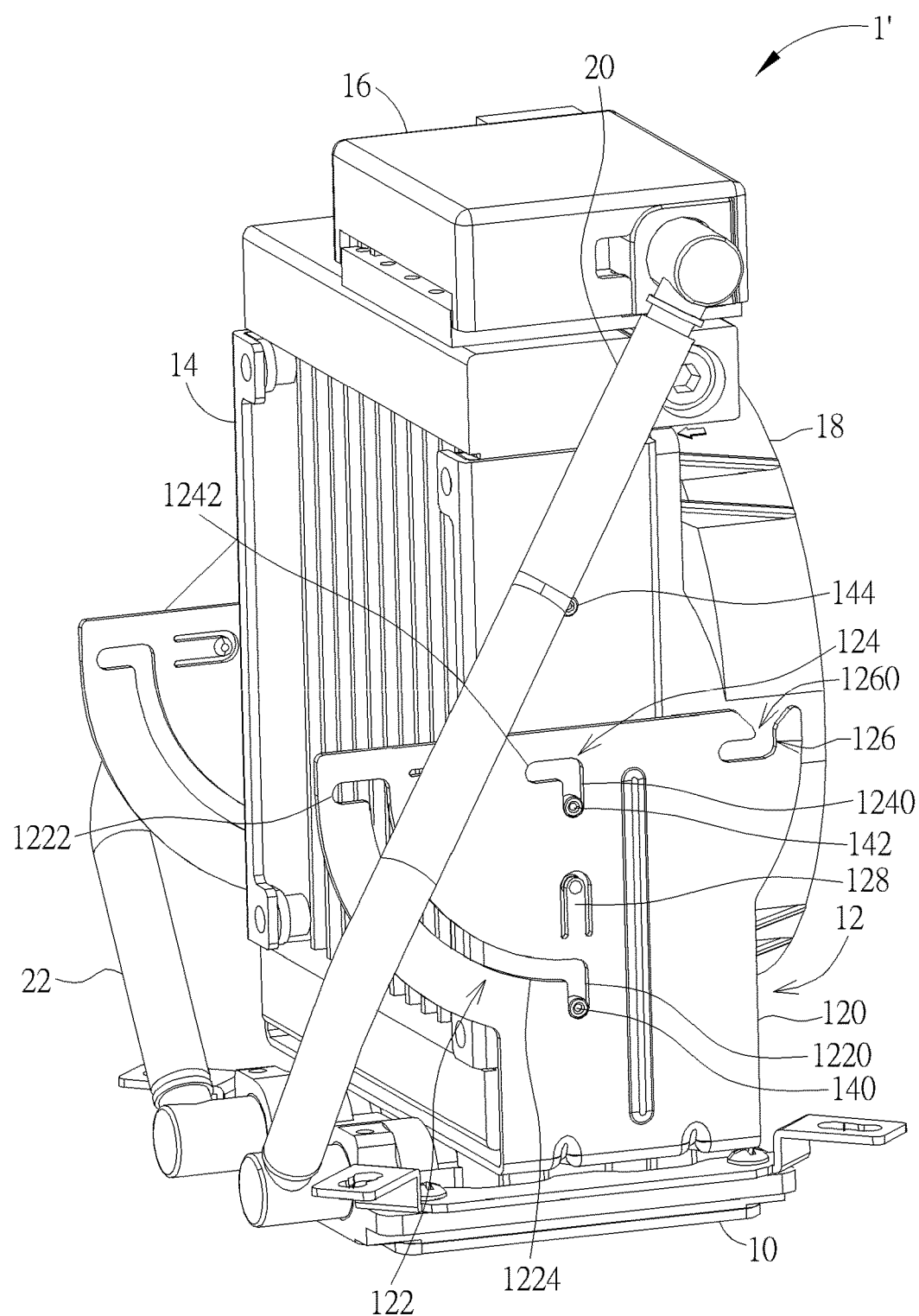
FIG. 8 is a schematic view illustrating a liquid cooling system according to another embodiment of the invention.
Figure 9:
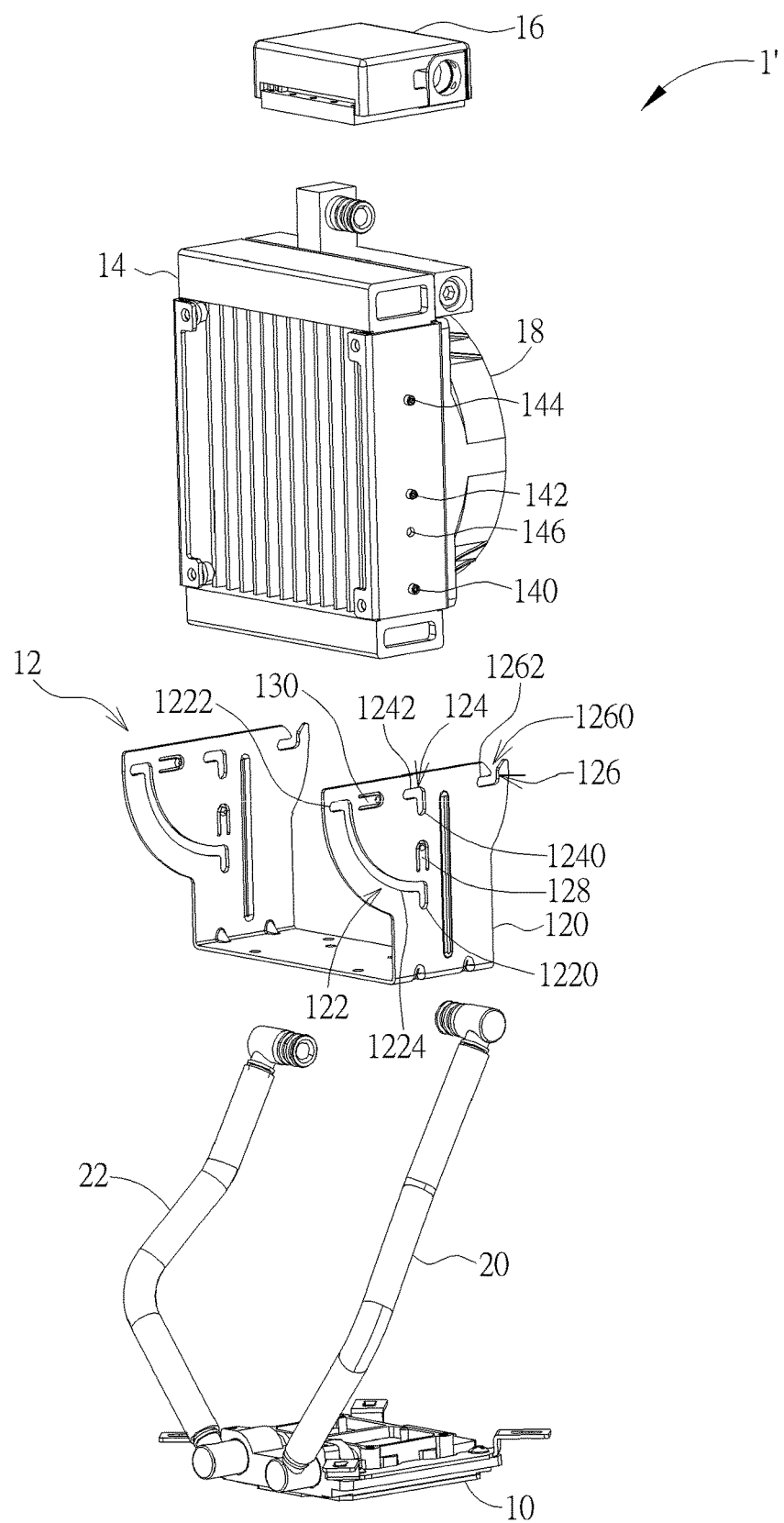
FIG. 9 is an exploded view illustrating the liquid cooling system shown in FIG. 8.
Figure 10:
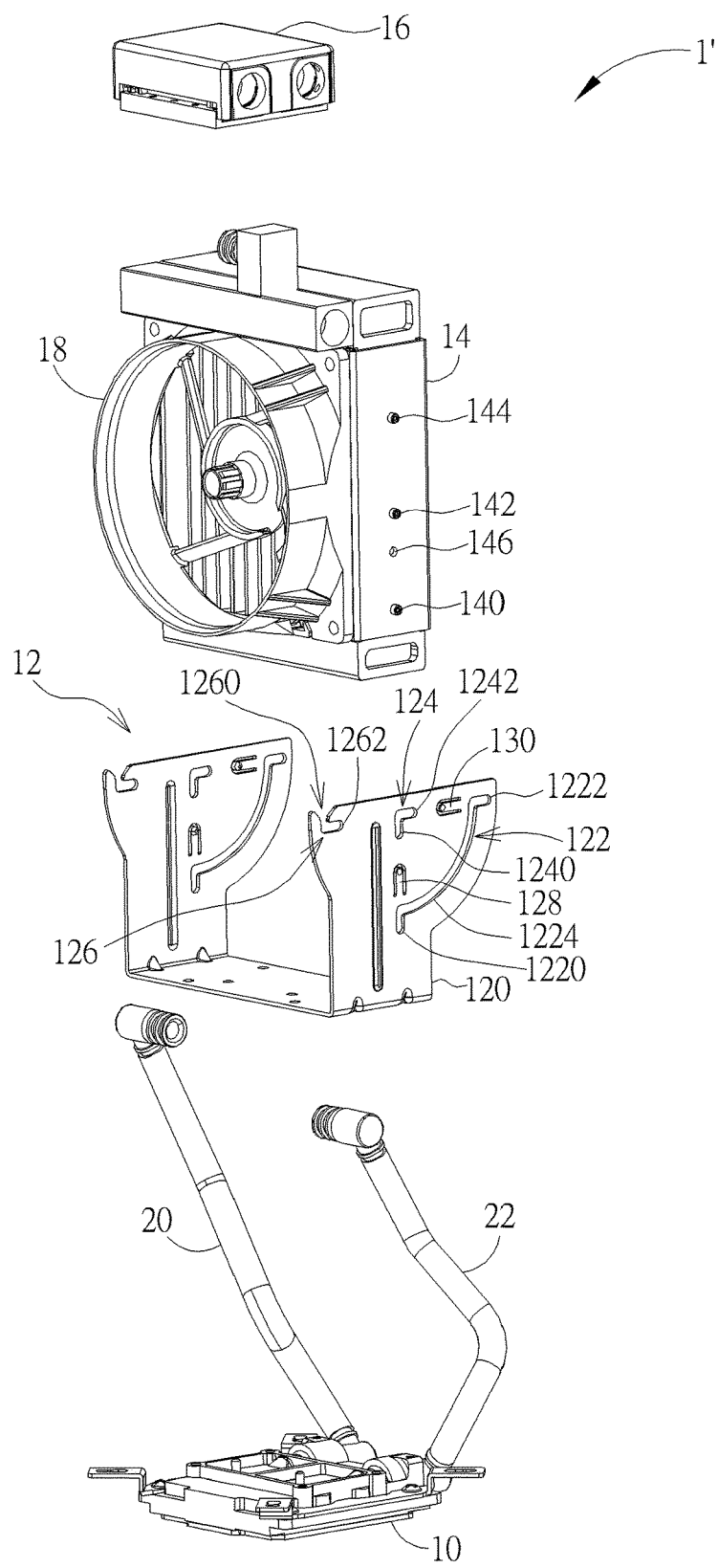
FIG. 10 is an exploded view illustrating the liquid cooling system shown in FIG. 8 from another viewing angle.
Figure 11:
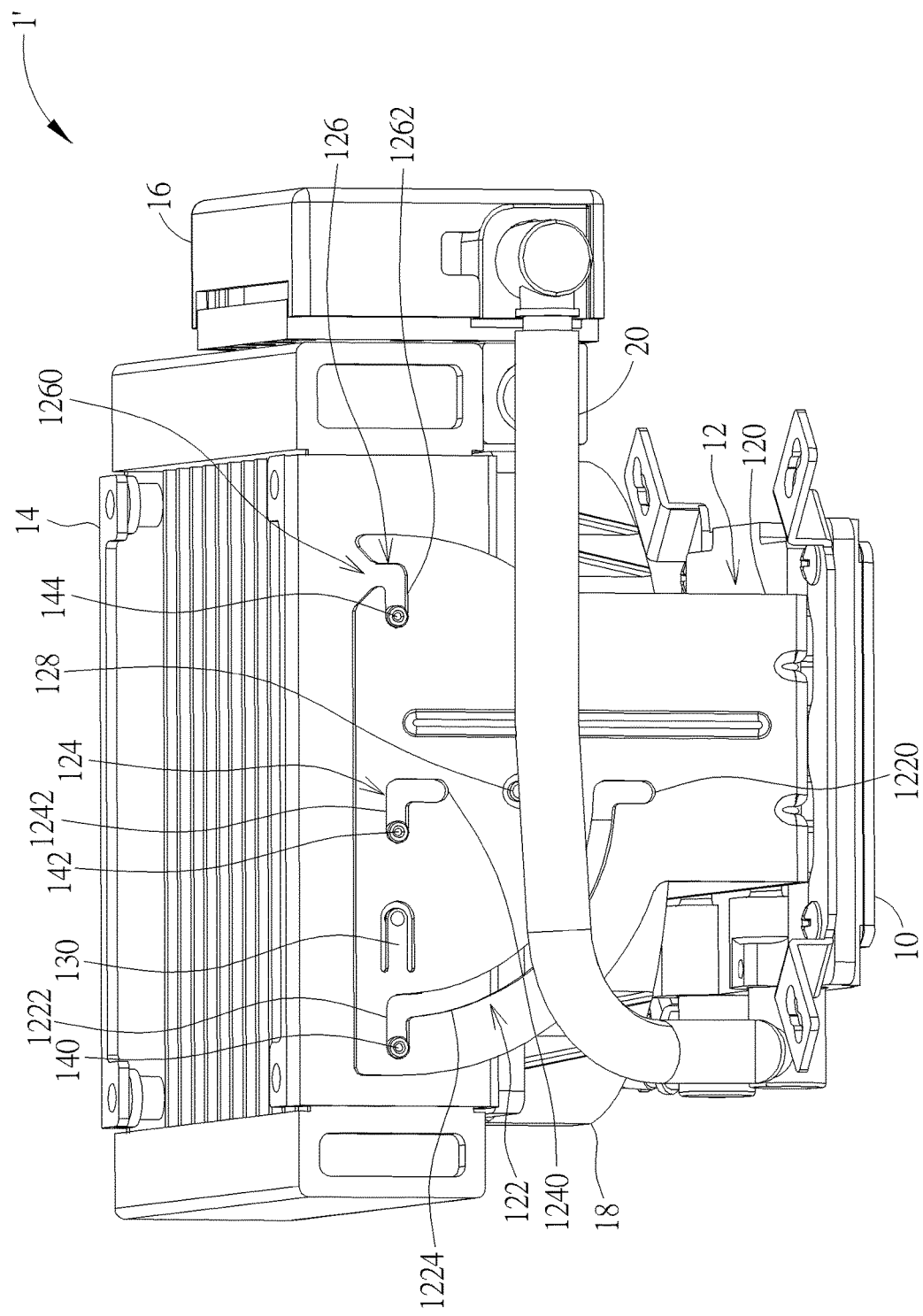
FIG. 11 is a schematic view illustrating the radiator shown in FIG. 8 after rotating.

Referring to FIGS. 8 to 11, FIG. 8 is a schematic view illustrating a liquid cooling system 1' according to another embodiment of the invention, FIG. 9 is an exploded view illustrating the liquid cooling system 1' shown in FIG. 8, FIG. 10 is an exploded view illustrating the liquid cooling system 1' shown in FIG. 8 from another viewing angle, and FIG. 11 is a schematic view illustrating the radiator 14 shown in FIG. 8 after rotating. The main difference between the liquid cooling system 1' and the aforesaid liquid cooling system 1 is that, in the liquid cooling system 1', each of the side plates 120 further has a first resilient arm 128 and a second resilient arm 130 and opposite sides of the radiator 14 have a fixing hole 146 formed thereon, as shown in FIGS. 9 and 10. In this embodiment, the first resilient arm 128 and the second resilient arm 130 are used for engaging the fixing hole 146. In other words, the liquid cooling system 1' replaces the first fixing structures 1226, 1228, the second fixing structures 1244, 1246 and the third fixing structure 1262 of the aforesaid liquid cooling system 1 by the first resilient arm 128, the second resilient arm 130 and the fixing hole 146. It should be noted that the same elements in FIGS.

8-11 and FIGS. 1-7 are represented by the same numerals, so the repeated explanation will not be depicted herein again.

When the radiator 14 moves with respect to the liquid cooling head 10 to the vertical position shown in FIG. 8, the first resilient arm 128 of the side plate 120 is engaged with the fixing hole 146 of the radiator 14. If a user wants to move the radiator 14 with respect to the liquid cooling head 10 from the vertical position shown in FIG. 8 to the horizontal position shown in FIG. 11, the user can move the radiator 14 with respect to the liquid cooling head 10 upward first. At this time, the first resilient arm 128 of the side plate 120 is disengaged from the fixing hole 146 of the radiator 14. Then, the user can rotate the radiator 14 with respect to the liquid cooling head 10 along the curved groove 1224. At this time, the third protruding portion 144 of the radiator 14 enters the third rail 126 through the opening 1260. Then, the user can move the radiator 14 with respect to the liquid cooling head 10 leftward to the position shown in FIG. 11. At this time, the second resilient arm 130 of the side plate 120 is engaged with the fixing hole 146 of the radiator 14.

If the user wants to move the radiator 14 with respect to the liquid cooling head 10 from the horizontal position shown in FIG. 11 to the vertical position shown in FIG. 8, the user can perform the aforesaid operation reversely and the repeated explanation will not be depicted herein again. Accordingly, the radiator 14 can move with respect to the liquid cooling head 10 between at least two different positions through the fixing member 12.

Figure 12:
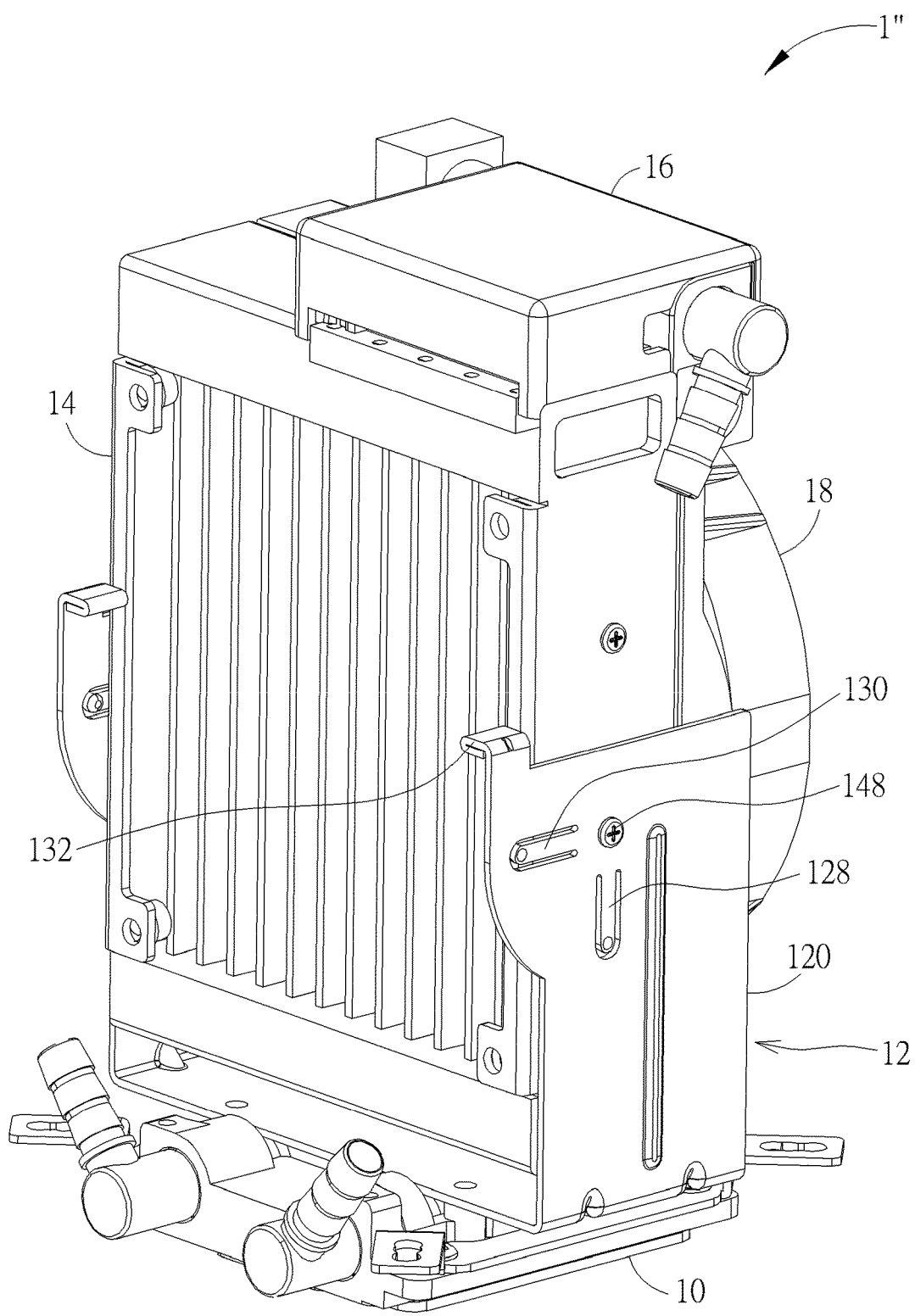
FIG. 12 is a schematic view illustrating a liquid cooling system according to another embodiment of the invention.
Figure 13:
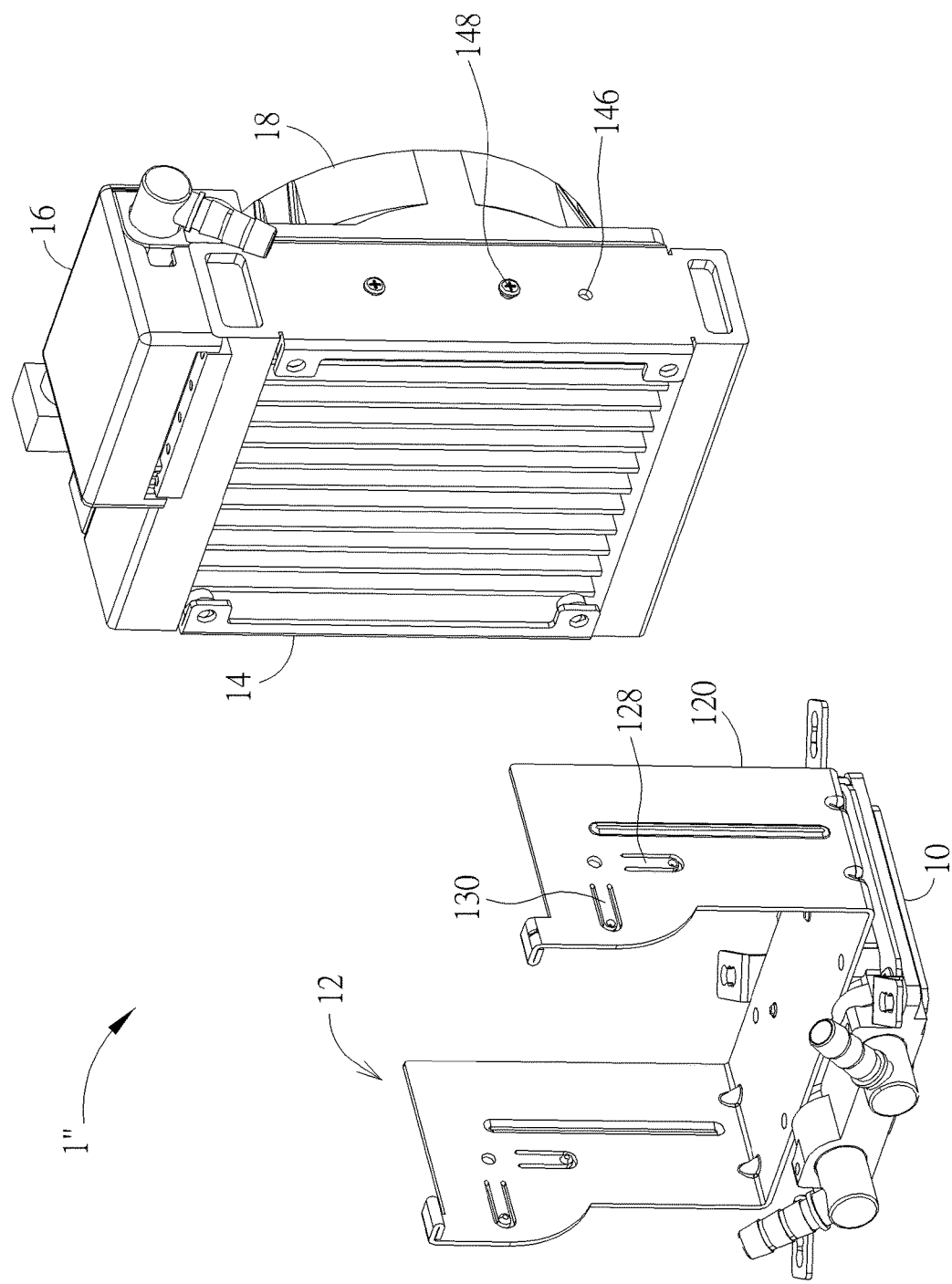
FIG. 13 is an exploded view illustrating the liquid cooling system shown in FIG. 12.
Figure 14:
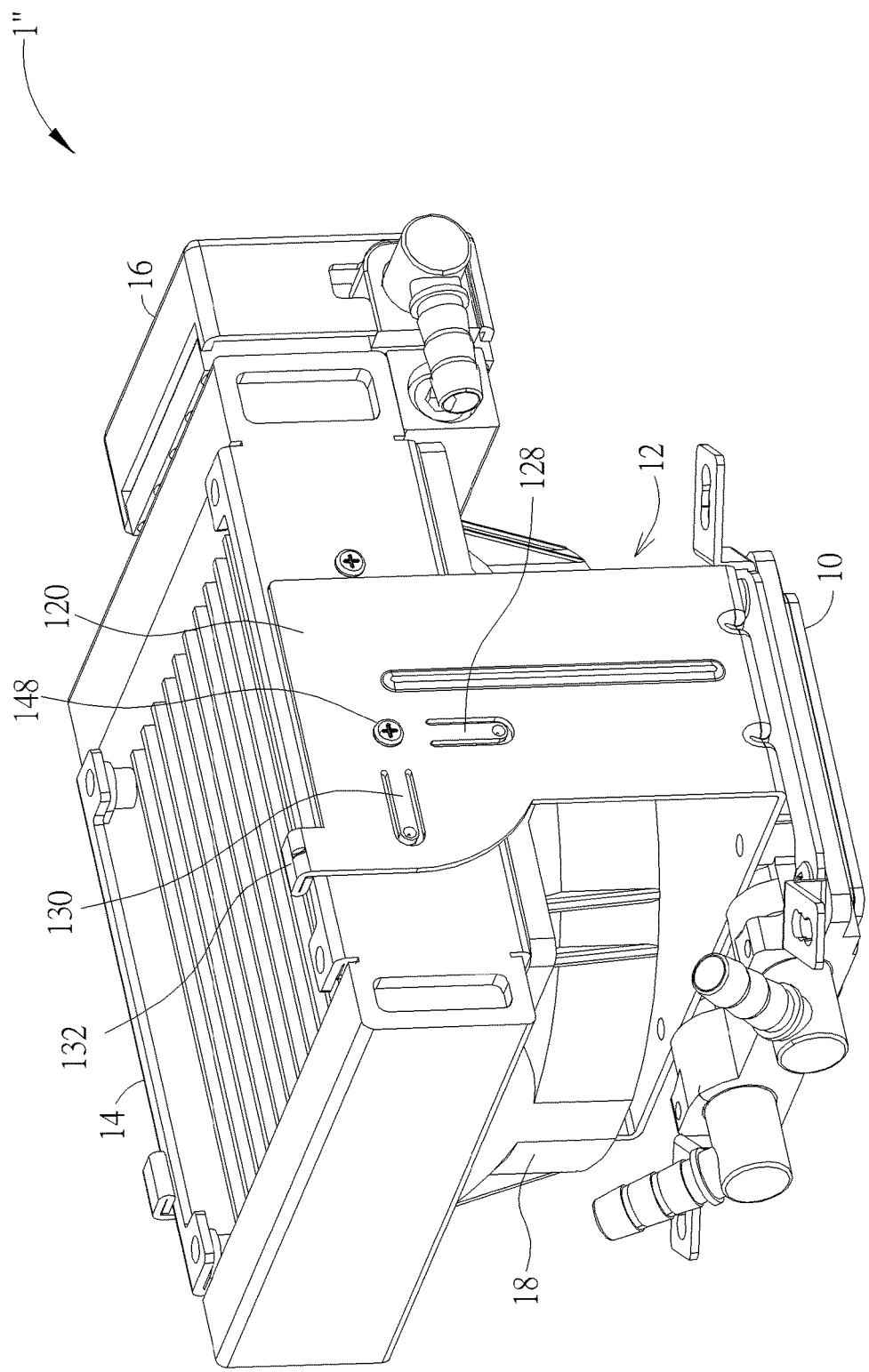
FIG. 14 is a schematic view illustrating the radiator shown in FIG. 12 after rotating.

Referring to FIGS. 12 to 14, FIG. 12 is a schematic view illustrating a liquid cooling system 1'' according to another embodiment of the invention, FIG. 13 is an exploded view illustrating the liquid cooling system 1'' shown in FIG. 12, and FIG. 14 is a schematic view illustrating the radiator 14 shown in FIG. 12 after rotating. The main difference between the liquid cooling system 1'' and the aforesaid liquid cooling system 1 is that, in the liquid cooling system 1'', the radiator 14 is pivotally connected to the two side plates 120 of the fixing member 12 by pivot 148, wherein each of the side plates 120 further has a first resilient arm 128 and a second resilient arm 130 and opposite sides of the radiator 14 has a fixing hole 146 formed thereon, as shown in FIG. 13. It should be noted that FIG. 13 only shows one fixing hole 146 at one side of the radiator 14 due to limited viewing angle. In this embodiment, the first resilient arm 128 and the second resilient arm 130 are user for engaging the fixing hole 146. Furthermore, each of the side plates 120 further has a restraining portion 132, wherein the restraining portion 132 is used for restraining a rotation angle of the radiator 14. It should be noted that the same elements in FIGS. 12-14 and FIGS. 1-7 are represented by the same numerals, so the repeated explanation will not be depicted herein again. Still further, the aforesaid tubes 20, 22 are omitted from FIGS. 12-14. In practical applications, this embodiment may also use the aforesaid tube 20 to connect the liquid cooling head 10 and the pump 16 and use the aforesaid tube 22 to connect the liquid cooling head 10 and the radiator 14.

When the radiator 14 moves with respect to the liquid cooling head 10 to the vertical position shown in FIG. 12, the first resilient arm 128 of the side plate 120 is engaged with the fixing hole 146 of the radiator 14. If a user wants to move the radiator 14 with respect to the liquid cooling head 10 from the vertical position shown in FIG. 12 to the horizontal position shown in FIG. 14, the user can rotate the radiator 14 directly. At this time, the first resilient arm 128 of the side plate 120 is disengaged from the fixing hole 146 of the radiator 14. When the radiator 14 rotates to the horizontal position shown in FIG. 14, the second resilient arm 130 of the side plate 120 is engaged with the fixing hole 146 of the radiator 14. In this embodiment, the restraining portion 132 may restrain the rotation angle of the radiator 14 within 90 degrees, but is not so limited, so as to prevent the radiator 14 from over-rotating.

If the user wants to move the radiator 14 with respect to the liquid cooling head 10 from the horizontal position shown in FIG. 14 to the vertical position shown in FIG. 12, the user can perform the aforesaid operation reversely and the repeated explanation will not be depicted herein again. Accordingly, the radiator 14 can move with respect to the liquid cooling head 10 between at least two different positions through the fixing member 12.

Figure 15:
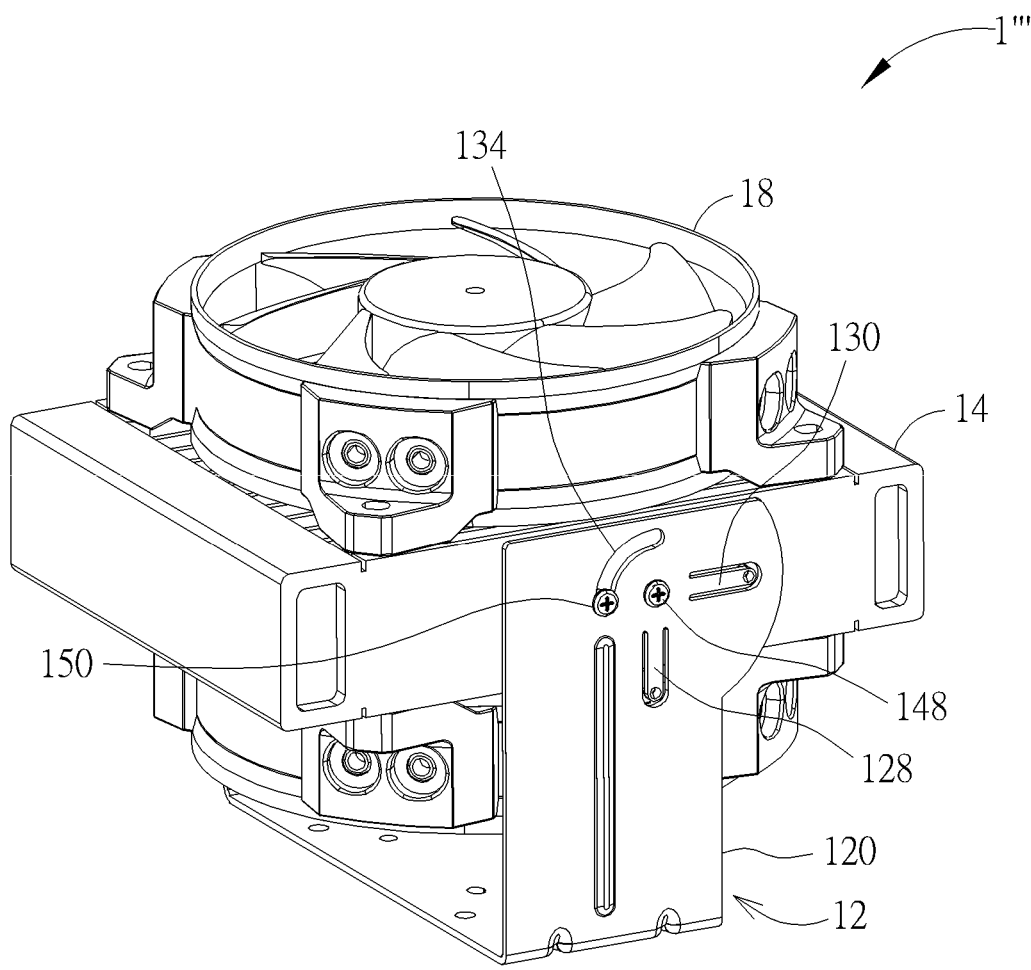
FIG. 15 is a schematic view illustrating a liquid cooling system according to another embodiment of the invention.
Figure 16:
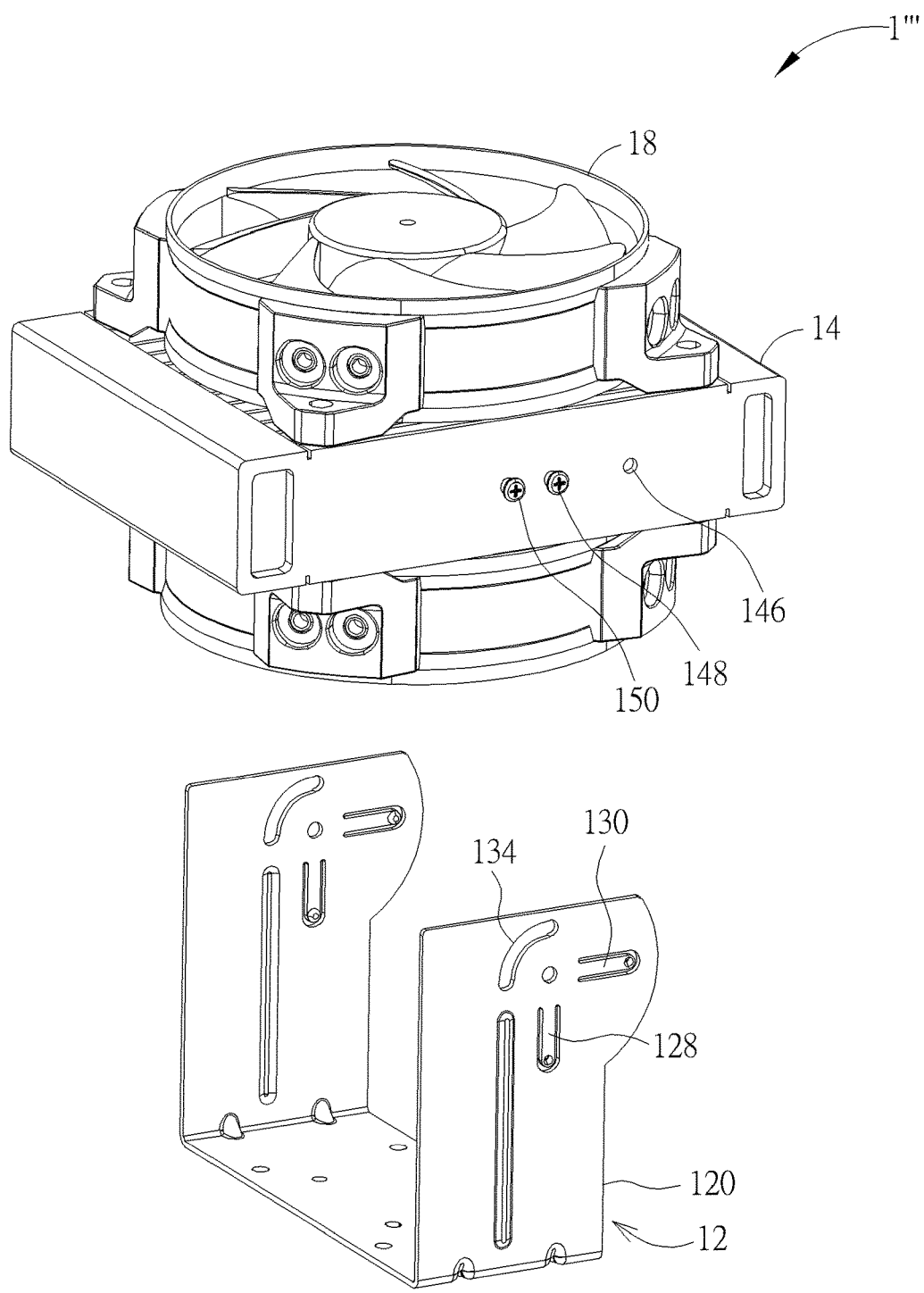
FIG. 16 is an exploded view illustrating the liquid cooling system shown in FIG. 15.

Referring to FIGS. 15 and 16, FIG. 15 is a schematic view illustrating a liquid cooling system 1''' according to another embodiment of the invention and FIG. 16 is an exploded view illustrating the liquid cooling system 1''' shown in FIG. 15. The main difference between the liquid cooling system 1''' and the aforesaid liquid cooling system 1'' is that, in the liquid cooling system 1''', each of the side plates 120 further has a restraining rail 134 and opposite sides of the radiator 14 have a restraining member 150, as shown in FIGS. 15 and 16. The restraining member 150 is disposed in the restraining rail 134, such that the restraining member 150 can cooperate with the restraining rail 134 to restrain a rotation angle of the radiator 14. In this embodiment, the restraining member 150 and the restraining rail 134 may restrain the rotation angle of the radiator 14 within 90 degrees, but is not so limited, so as to prevent the radiator 14 from over-rotating. It should be noted that the same elements in FIGS. 15-16 and FIGS. 12-14 are represented by the same numerals, so the repeated explanation will not be depicted herein again. Still further, the aforesaid liquid cooling head 10 is omitted from FIGS. 15-16. In practical applications, this embodiment may also dispose the fixing member 12 on the aforesaid liquid cooling head 10.

As mentioned in the above, since the radiator can move with respect to the liquid cooling head between at least two different positions, a user or a manufacturer can adjust the position of the radiator with respect to the liquid cooling head according to the arrangement of electronic components in an electronic device, so as to prevent the liquid cooling system from interfering with the electronic components in the electronic device. Accordingly, the liquid cooling system of the invention can be applied to various electronic devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A liquid cooling system comprising:
   a liquid cooling head;
   a fixing member disposed on the liquid cooling head; and
   a radiator disposed on the liquid cooling head through the fixing member, the radiator moving with respect to the liquid cooling head between at least a vertical position and a horizontal position through the fixing member,
   wherein an angle between a longitudinal axis of the radiator in the vertical position and the longitudinal axis of the radiator in the horizontal position is 90 degrees;
   where in the fixing member has two side plates opposite to each other, each of the side plates has a first rail and a second rail, the radiator is disposed between the two side plates, each of two opposite sides of the radiator has a first protruding portion and a second protruding portion, the first protruding portions are respectively disposed in the first rails, the second protruding portions are respectively disposed in the second rails, and the first protruding portions and the second protruding portions are capable of moving with respect to the first rails and the second rails, such that the radiator moves with respect to the liquid cooling head between the vertical position and the horizontal position; and each of the first rails has two first straight grooves and a curved groove, the two first straight grooves are connected to opposite ends of the curved groove, each of the second rails has two second straight grooves, and the two second straight grooves are connected to each other.

2. The liquid cooling system of claim 1, wherein extending directions of the two first straight grooves correspond to extending directions of the two second straight grooves.

3. The liquid cooling system of claim 1, wherein the curved groove is a quarter-circle groove and the two second straight grooves are connected to form an L shape.

4. The liquid cooling system of claim 1, wherein each of the first straight grooves has a first fixing structure for fixing the first protruding portion.

5. The liquid cooling system of claim 1, wherein each of the second straight grooves has a second fixing structure for fixing the second protruding portion.

6. The liquid cooling system of claim 1, wherein each of the side plates further has a third rail, each of the third rails has an opening, each of the two opposite sides of the radiator further has a third protruding portion, and the third protruding portions respectively enter or exit the third rails through the openings when the radiator moves with respect to the liquid cooling head.

7. The liquid cooling system of claim 6, wherein each of the third rails is a straight groove and has a third fixing structure for fixing the third protruding portion.

8. The liquid cooling system of claim 1, wherein each of the side plates further has a first resilient arm and a second resilient arm, each of the two opposite sides of the radiator has a fixing hole formed thereon, and the first resilient arms and the second resilient arms are used for engaging the fixing holes.

9. The liquid cooling system of claim 1, further comprising a fan disposed on the radiator.

10. The liquid cooling system of claim 1, further comprising a pump selectively disposed on the radiator or the liquid cooling head.

11. The liquid cooling system of claim 1, wherein the fixing member has two side plates opposite to each other, the radiator is disposed between and pivotally connected to the two side plates, each of the side plates has a first resilient arm and a second resilient arm, each of two opposite sides of the radiator has a fixing hole formed thereon, and the first resilient arms and the second resilient arms are used for engaging the fixing holes.

12. The liquid cooling system of claim 11, wherein each of the side plates further has a restraining portion and the restraining portion restrains a rotation angle of the radiator.

13. The liquid cooling system of claim 11, wherein each of the side plates further has a restraining rail, each of the two opposite sides of the radiator has a restraining member, the restraining members are respectively disposed in the restraining rails, and the restraining members cooperate with the restraining rails to restrain a rotation angle of the radiator.

* * * * *